United States Patent [19]
Ingram

[11] Patent Number: 5,328,554
[45] Date of Patent: Jul. 12, 1994

[54] FABRICATION PROCESS FOR NARROW GROOVE

[75] Inventor: Simon G. Ingram, Cambridge, England

[73] Assignee: GEC-Marconi Limited, England

[21] Appl. No.: 980,656

[22] Filed: Nov. 24, 1992

[30] Foreign Application Priority Data

Dec. 13, 1991 [GB] United Kingdom ............... 9126533

[51] Int. Cl.$^5$ .................. H01L 21/306; B44C 1/22; C03C 15/00; C23F 1/00
[52] U.S. Cl. ................... 156/643; 156/656; 156/657; 156/659.1; 156/662; 437/241; 437/245
[58] Field of Search ............. 156/643, 644, 648, 656, 156/657, 659.1, 662, 665; 437/65–79, 241, 245, 203

[56] References Cited

U.S. PATENT DOCUMENTS

| 4,053,349 | 10/1977 | Simko | 156/657 X |
| 4,460,434 | 7/1984 | Johnson et al. | 156/657 X |
| 4,650,544 | 3/1987 | Erb et al. | 156/648 X |

Primary Examiner—William A. Powell
Attorney, Agent, or Firm—Kirschstein

[57] ABSTRACT

In a process for producing a narrow groove in a layer of, for example, silicon nitride, a wide groove is first formed in the layer. A layer of a metal, for example aluminium, is evaporated on to one side of the wide groove. The remainder of the wide groove is then filled with a material such a silicon nitride. The metal layer is then etched away, leaving a narrow groove in the silicon nitride equal to the thickness of the metal layer.

10 Claims, 2 Drawing Sheets

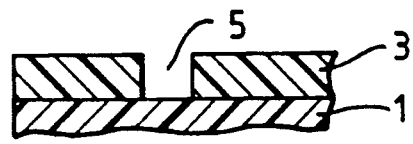
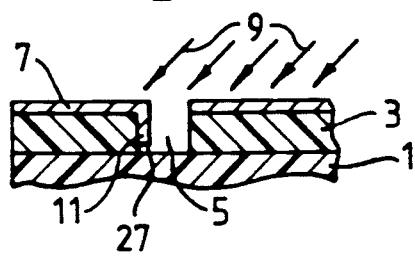
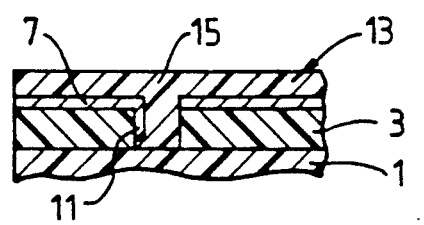
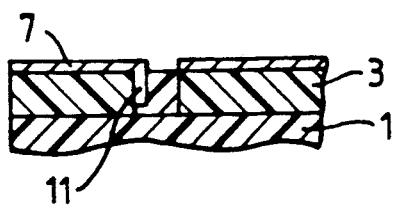
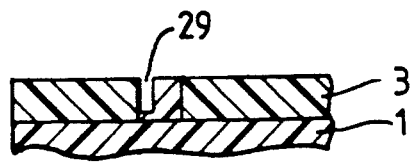

FABRICATION PROCESS FOR NARROW GROOVE

BACKGROUND OF THE INVENTION

1. Field of the Invention

This invention relates to a fabrication process, and particularly to a process for producing grooves of very small (e-g, nanometre) dimensions in, for example, silicon nitride,

2. Description of Related Art

The fabrication of, for example, large-scale integrated circuits can necessitate the production of grooves (commonly known as "trenches") of sub-micron width and depth. The trenches must be of uniform width along their length.

The accurate production of such narrow trenches is very difficult to achieve lithographically, even with the use of expensive electron beam, ion beam or x-ray lithography equipment and processes.

SUMMARY OF THE INVENTION

It is an object of the present invention to provide an improved process for producing such grooves or trenches.

According to the invention there is provided a process for producing a narrow groove in a layer of first material, the process comprising the steps of forming a relatively wide groove in said layer of first material; depositing on a side wall of said relatively wide groove a layer of a second material, the thickness of said layer of second material being equal to the required narrow groove width; filling the remainder of the relatively wide groove with a third material which is the same as or different from said first material; and selectively removing said second material to produce said narrow groove in the layer of first and third materials, without significantly removing said first and third materials.

The layer of first material may be deposited on a substrate, and may be used as a mask in a process for producing a groove in the substrate, in which etching of the substrate is effected through said narrow groove in the layer of first and third materials.

BRIEF DESCRIPTION OF THE DRAWINGS

Embodiments of the invention will now be described, by way of example, with reference to the accompanying drawing, in which FIGS. 1(a) to 1(g) are schematic cross-sectional views illustrating steps in a first fabrication process in accordance with the invention and FIGS. 2(a) to 2(f) are schematic cross-sectional views illustrating steps in a second fabrication process in accordance with the invention.

DETAILED DESCRIPTION OF THE PREFERRED EMBODIMENTS

Figure 1A:
Figure 1B:
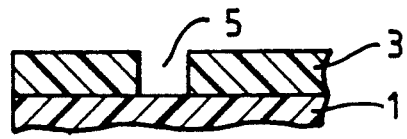

Referring to FIG. 1(a), a substrate 1 formed of, for example, silicon is firstly cleaned, and a layer 3 of silicon nitride is deposited thereon by, for example, plasma enhanced chemical vapour deposition or other suitable deposition technique. The layer 3 may be, for example, 100 nm thick. The position of a slot 5 is defined by, for example, producing a patterned mask on the layer using electron beam lithography. The width of the slot 5 is preferably substantially equal to the thickness of the layer 3. The slot 5 is produced by etching the layer 3 down to the surface of the substrate, using a reactive ion etch, such as $CF_4$ and $O_2$, through the mask.

Figure 1C:
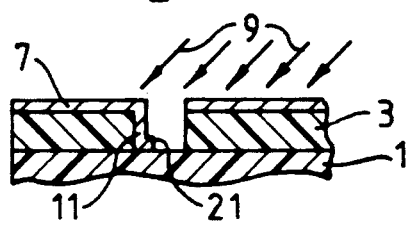

A layer 7 of aluminium is deposited by evaporation over the surface of the layer 3, the evaporation being effected at an angle of 45°, as indicated by arrows 9 in FIG. 1(c), so that there is substantially no deposition of aluminium in the slot 5 except on one side wall 11. The deposition of aluminum is carefully controlled and is terminated when the thickness of the layer on the side wall 11 is equal to the width of the required trench, say 10 nm.

Figure 1D:
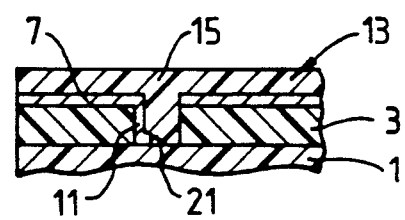

A silicon nitride layer 13 (FIG. 1(d)) is then deposited over the aluminium layer 7 and filling the remainder of the slot 5. The filling of the slot 5 must be effected without any voids being formed in the silicon nitride adjacent the aluminium-covered side wall 11 and adjacent the bottom of the slot.

Figure 1E:
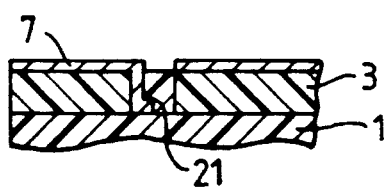
Figure 1F:
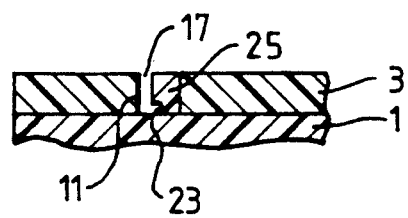
Figure 1G:
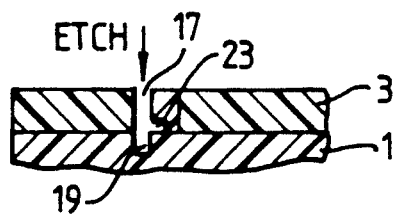

The upper region 15 of the layer 13 (as viewed in FIG. 1(d)) is then etched away to reveal the horizontal portions of the aluminium layer (FIG. 1(e)). Preferably the silicon nitride filling the slot 5 is etched back level with the top of the layer 3.

The aluminium is then entirely dissolved in NaOH, leaving a vertical trench 17, the width of which is equal to the thickness of the portion of the layer 7 previously disposed on the side wall 11. The trench width is therefore very accurately and simply controlled by controlling the thickness of the layer 7 deposited on the side wall.

An accurate trench 19 (FIG. 1(h)) can be formed in the substrate by using the layer 3 as a mask during a directional plasma etching process. The etching is effected through the trench 17 and is maintained parallel to the side walls of the trench, so that the resulting trench 19 in the substrate 1 is the same width as the trench 17. The width of the trench 19 is therefore determined by the thickness of the layer 7 initially deposited on the wall 11, as described above.

If desired, the layer 3 may then be removed from the substrate 1.

It will be apparent that a number of trenches 17, 19 may be formed simultaneously on a substrate by the process described above, provided that a trench spacing greater than the width of the slot 5 is acceptable. If a closer spacing is required, a first set of trenches may be formed at the relatively wide spacing, and then the layer 3 may be removed and the whole process repeated, beginning with the deposition of new layer 3 on the substrate, to produce trenches between those of the first set. The processing cycle may then, if desired, be repeated a number of times to produce further, progressively closer, trenches. The cost, and the time consumed, will, of course, increase with the number of processing cycles.

If the aspect ratio of the slot 5 and the angle of incidence of the aluminium deposition are not accurately matched, a small quantity of extraneous aluminium 21 may be deposited in the bottom corner of the slot 5. This will then result in the production of a groove 23 in the side wall 25 of the trench immediately adjacent the surface of the substrate 1. The size the groove 23 should be minimised, as it may affect the subsequent etching of the trench 19.

FIGS. 2(a) to 2(f) illustrate the same processes as in FIGS. 1(a) to 1(f), respectively, but in this case the width of the slot 5 and the angle of incidence of the aluminium deposition are determined such that the portion of the layer 7 on the wall 11 of the slot 5 does not reach the bottom of the slot, so that a gap 27 is left between the end of the layer and the bottom of the slot. When the slot 5 is filled by the layer 13, the gap 27 is also filled.

On removal of the layer 7, a trench 29 which does not extend through the complete thickness of the layer 3 is produced.

Although aluminium is proposed above as the material for defining the trench width, other materials may alternatively be used provided that such material has the following characteristics:

(a) It can be deposited at an angle to the surface of the layer 3, which requires that it can be deposited by evaporation. Most metals and some insulating materials meet this requirement.

(b) It must be capable of adhering to the layer 3.

(c) It should have small grain size. Most metals are suitable from this point of view.

(d) It must be selectively removable by a process which does not attack the layer 3, the layer 13 or the substrate 1.

The layers 3 and 13 may alternatively be formed of other suitable materials instead of silicon nitride. Any such material must have the following characteristics:

(a) It must adhere well to the substrate 1.

(b) It must provide a smooth layer.

(c) It must be capable of deposition in a sufficiently thick layer.

(d) It must be resistant to the solvent used for removing the layer 7.

Examples of suitable materials are silicon dioxide, polyimide, some glasses, and spun-on resist materials.

I claim:

1. A process for producing a narrow groove in a layer of a first material, the process comprising the steps of: forming a relatively wide groove in said layer of first material; depositing on a side wall of said relatively wide groove a layer of aluminum, the thickness of said layer of aluminum being equal to the required narrow groove width; filling the remainder of the relatively wide groove with a third material which is the same as or different from said first material; and selectively removing said aluminum to produce said narrow groove in the layer of first and third materials without significantly removing said first and third materials.

2. A process as claimed in claim 1, wherein the layer of aluminum is deposited over a major surface of the layer of first material and on to said side wall, but leaving all other surfaces of the relatively wide groove substantially free of said aluminum.

3. A process as claimed in claim 2, wherein the layer of aluminum is deposited by evaporating the aluminum at an oblique angle to said major surface; and wherein the width of said relatively wide groove is selected, in combination with said angle, to ensure that said other surfaces of the relatively wide groove are left substantially free of said aluminum.

4. A process for producing a narrow groove in a layer of a first material, the process comprising the steps of: forming a relatively wide groove in said layer of first material; depositing over a major surface of said layer of first material and on to a side wall of said relatively wide groove a layer of a second material by evaporating said second material at an oblique angle to said major surface such that the other surfaces of said relatively wide groove are left substantially free of said second material, the thickness of said layer of second material being equal to the required narrow groove width; filling the remainder of the relatively wide groove with a third material; and selectively removing said second material to produce said narrow groove between said first and third materials without significantly removing said first and third materials.

5. A process as claimed in claim 4, wherein said layer of first material is provided on a substrate; and wherein said layer of second material extends over the whole depth of said side wall, whereby said narrow groove extends through said layer of first material to the substrate.

6. A process as claimed in claim 5, including a further step of etching the substrate through said narrow groove in the layer of first material to produce a corresponding narrow groove in the substrate.

7. A process as claimed in claim 6, wherein after production of said narrow groove in the substrate the layer of first and third materials is removed from the substrate.

8. A process as claimed in claim 4, wherein said first material is silicon nitride.

9. A process as claimed in claim 8, wherein said third material filling the remainder of the relatively wide groove is silicon nitride.

10. A process as claimed in claim 4, wherein said second material is aluminum.

* * * * *